(12) United States Patent
Tafti et al.

(10) Patent No.: US 9,259,693 B2
(45) Date of Patent: Feb. 16, 2016

(54) MICROFLUIDIC MIXING USING CHANNEL WIDTH VARIATION FOR ENHANCED FLUID MIXING

(71) Applicant: University of Central Florida Research Foundation, Inc., Orlando, FL (US)

(72) Inventors: Ehsan Yakhshi Tafti, Oviedo, FL (US); Hyoung Jin Cho, Oviedo, FL (US); Ranganathan Kumar, Chuluota, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 386 days.

(21) Appl. No.: 13/853,628

(22) Filed: Mar. 29, 2013

(65) Prior Publication Data

US 2013/0223182 A1    Aug. 29, 2013

Related U.S. Application Data

(62) Division of application No. 12/553,241, filed on Sep. 3, 2009, now Pat. No. 8,430,558.

(60) Provisional application No. 61/094,529, filed on Sep. 5, 2008.

(51) Int. Cl.
*B01F 5/06* (2006.01)
*B81B 1/00* (2006.01)
*B01F 13/00* (2006.01)

(52) U.S. Cl.
CPC ............. *B01F 5/0603* (2013.01); *B01F 5/065* (2013.01); *B01F 13/0059* (2013.01);
(Continued)

(58) Field of Classification Search
CPC .... B01F 5/065; B01F 5/0603; B01F 13/0059; B01F 13/0061; B01F 13/0064; B01F 2215/0431; B01B 1/00; Y10S 366/03

USPC ...... 366/341, DIG. 1, DIG. 2, DIG. 3, DIG. 4
See application file for complete search history.

(56) References Cited

U.S. PATENT DOCUMENTS

| | | | | |
|---|---|---|---|---|
| 3,459,407 | A * | 8/1969 | Hollis et al. | 366/338 |
| 6,010,316 | A * | 1/2000 | Haller et al. | 417/322 |
| 6,176,991 | B1 * | 1/2001 | Nordman | 204/601 |
| 6,270,641 | B1 * | 8/2001 | Griffiths et al. | 204/451 |

(Continued)

OTHER PUBLICATIONS

"Enhanced Microfluidic Mixing Using Planar Cured Channel Geometries", Arjun P. Sudarsan and Victor M. Ugaz, 8th Inernational convference on Miniaturized Systems for Chemistry and Life Sciences, Sep. 26-30, 2004, Malmo, Sweden, pubished in Micro Total Anaylsis Systems 2004, vol. 1 pp. 198-200, ISBN 0-85404-643-7.*

(Continued)

*Primary Examiner* — Tony G Soohoo
(74) *Attorney, Agent, or Firm* — Jetter & Associates, P.A.

(57) ABSTRACT

A fluid mixing method using a micromixing apparatus which includes a mixing microchannel having a channel length and a continuously variable channel width defined by a first sidewall surface and an opposing second sidewall surface. The channel width varies from a minimum channel width h to a maximum channel width H in a ratio of H:h≥1.1:1.0. A first inlet injects a first fluid and a second inlet a second fluid into the mixing microchannel which both flow in a flow direction in the mixing microchannel along the channel length. The first sidewall surface includes first curved surface portions and the second sidewall surface includes second curved surface portions. The first and second curved surface portions are non-overlapping to provide the variable channel width. The flow velocity profile is passively varied and exclusively controlled by the continuously variable channel width.

12 Claims, 3 Drawing Sheets

(52) U.S. Cl.
CPC .............. *B01F 13/0064* (2013.01); *B81B 1/00* (2013.01); *B01F 5/0655* (2013.01); *B01F 13/0061* (2013.01); *B01F 2215/0431* (2013.01); *Y10S 366/03* (2013.01)

(56) References Cited

U.S. PATENT DOCUMENTS

2006/0283980 A1* 12/2006 Wang ........................... 239/432

OTHER PUBLICATIONS

Chien-Chong Hong, et al., "A novel in-plane passive microfluidic mixer with modified Tesla structures", Miniaturisation for Chemistry, Biology & Bioengineering, Lab Chip, 2004, 4, pp. 109-113.
Nam-Trung Nguyen, et al., "Micromixers—a review", Journal of Micromechanics and Microengineering, 15 (2005) R1-R16.

* cited by examiner

MICROFLUIDIC MIXING USING CHANNEL WIDTH VARIATION FOR ENHANCED FLUID MIXING

CROSS-REFERENCE TO RELATED APPLICATIONS

This application is a divisional application of U.S. non-provisional patent application Ser. No. 12/553,241 entitled "MICROFLUIDIC MIXER HAVING CHANNEL WIDTH VARIATION FOR ENHANCED FLUID MIXING" filed Sep. 3, 2009, now U.S. Pat. No. 8,430,558, which claims priority to provisional application Ser. No. 61/094,529 entitled "MICROFLUIDIC MIXER", filed Sep. 5, 2008, both of which are incorporated by reference in their entirety into this application.

U.S. GOVERNMENT RIGHTS

The U.S. Government has rights to embodiments of this invention based on National Science Foundation grant ECS-0348603.

FIELD

Disclosed embodiments relate to micro-mixing apparatus having passive features for generating enhanced fluid mixing of miscible fluid streams, and methods of microfluidic mixing.

BACKGROUND

Fluid mixing is a key operation for a variety of processes. For example, fluid mixing is an important unit operation for lab-on-a-chip (LOC) bio-analysis system where often quick and efficient mixing of reactants is required. In the case of a microfluidic mixer, the mixer has to provide a sufficiently mixed solution in a confined length of the micro-device, such as before the point where detection is taking place.

Fluidic devices made by MicroElectroMechanicSystem (MEMS) technology are generally termed microfluidics, which have channel dimensions ranging from microns to a few millimeters. Since it is possible to perform micro fabrication with high accuracy and low cost due to the development of lithography-based processing, microfluidic devices such as mixing apparatus (micro mixer), chemical reactors (micro reactor), micro TAS (Total Analysis System: LOC) and microchemistry plants are all known.

Mixing in microfluidic devices can be provided by active mixing systems or passive mixing systems. Active mixing systems utilize one or more powered sources to enhance mixing, such as vibrational sources to induce vibration in the microchannel. The need to supply power and its associated powered source adds to the cost, complexity and usefulness in certain mixing applications.

Passive systems provide a versatile solution to simplify the design and fabrication of microfluidic devices, and are highly compatible with current microfabrication techniques. Hence, passive mixing systems provide a cost-effective mixing solution. In a conventional T-mixer or Y-mixer, 2 microchannels having a small channel width (e.g., 50-100 µm) are merged into a single microchannel (e.g. 100 µm channel width) in which mixing takes place. Due to the small dimensions of the microchannels, fluid flow is generally highly laminar and mass transport in the mixing channel occurs only by diffusion, normal to the flow direction. To improve mixing, passive mixing systems can include shaping of the mixing microchannel (e.g., a serpentine or wavy constant width microchannel), or flow obstacles within the mixing microchannel.

SUMMARY

This Summary is submitted with the understanding that it will not be used to interpret or limit the scope or meaning of the claims.

Embodiments of the invention describe passive methods of microfluidic mixing using micromixing apparatus that provide improved mixing efficiency. The Inventors have recognized that the diffusive mass flux between two miscible fluid streams flowing in a generally laminar manner in a mixing microchannel is enhanced if the velocity at their diffusion interfaces are increased. Based on this recognition, an in-plane passive micromixing concept is described herein for use in various fluid mixing apparatus.

The micromixing apparatus have opposing sidewalls that include out of phase curved surface portions that thus provide a variable microchannel width along the length of the mixing microchannel. The variable microchannel width is such that the maximum of the flow velocity profile coincides with the transversely progressing (outwardly from the centerline) diffusion fronts repeatedly (i.e. a plurality of times) throughout the length of the mixing microchannel. The varying is generally periodic varying. Such arrangements increase the velocity at the diffusion interface between the fluids which has been found by the inventors to enhances the diffusive mass flux between the two fluid streams flowing in the microchannel, and thus enhance mixing.

BRIEF DESCRIPTION OF THE DRAWINGS

FIG. 4A shows mixing performance obtained from an exemplary micromixing apparatus according to an embodiment of the invention at a given mixing length (L=8 mm) as a function of flow Reynolds number (Re), while

DETAILED DESCRIPTION

Figure 1:
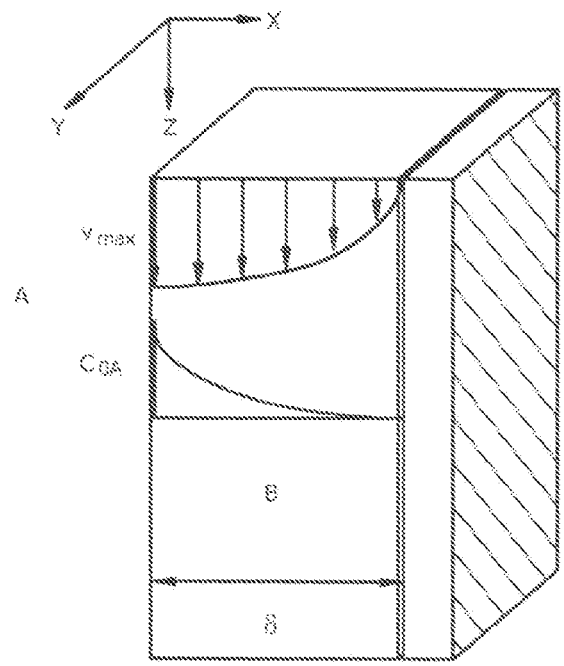
FIG. 1 shows a depiction of Species A diffusing into liquid film B flowing with a given velocity profile, provided to aid in understanding of certain theoretical aspects of embodiments of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

As described above, the Inventors have recognized that the diffusive mass flux between two miscible fluid streams flowing laminar in a microchannel is significantly enhanced if the velocity at their diffusion interfaces are increased. The effect of velocity on diffusion across an interface is described from a theoretical basis below. Although the theory presented herein is believed to be accurate, embodiments of the invention may be practiced independent of the theory underpinning the mixing efficiency evidenced in the Examples provided herein by micromixing apparatus according to embodiments of the invention.

FIG. 1 is a depiction of Species A from a constant source shown diffusing in the z-direction into a liquid film B, flowing with a given velocity profile, provided to aid in understanding certain theoretical aspects of embodiments of the invention. The simplified transport (differential) equation for describing the concentration of Species A in film B, $c_A$, can be written as follows with $D_{A,B}$ being the binary diffusion constant, where the maximum velocity of Species B at the interface is $v_{max}$.

$$v_{max} \frac{\partial c_A}{\partial z} = D_{A,B} \frac{\partial^2 c_A}{\partial x^2} \quad (1)$$

The boundary conditions are: $c_A=0$ (at z=0), $c_A=c_{0A}$ (at x=0), and $\partial c_A/\partial x=0$ (x=δ).

Using a similarity variable approach, the solution to (1) has the following form:

$$\frac{c_A}{c_{0A}} = 1 - \frac{2}{\sqrt{\pi}} \int_0^{x/\sqrt{4D_{A,B}z/v_{max}}} \exp(-\xi^2)\,d\xi = \text{erfc}\left(\frac{x}{\sqrt{4D_{A,B}z/v_{max}}}\right) \quad (2)$$

The local mass flux of Species A at the interface may be found as follows:

$$N_{A,x,interface}(z) = -D_{A,B}\frac{\partial c_A}{\partial x_{x=0}} = c_{0A}\sqrt{\frac{D_{A,B}v_{max}}{\pi z}} \quad (3)$$

It is observed from (3) above that increasing the magnitude of the velocity at the interface ($v_{max}$) translates into enhancement of the diffusive mass flux across the interface.

Mixing is now considered where two miscible liquids flow side by side in a laminar flow regime, so that a diffusion front for each fluid (thus 2 diffusion fronts and as a result 2 interfaces) would be developed. These diffusion fronts progress in the transverse direction (i.e. away from the centerline of the microchannel) as one moves downstream in the microchannel. Based on Einstein's relationship for Brownian motion, the position of the diffusion fronts/interfaces progresses in the transverse direction (relative to the flow direction) as follows:

$$x'(z)=(2D_{A,B}\tau)^{1/2}=(2D_{A,B}z/U)^{1/2} \quad (4)$$

where x', τ and U are displacement of the interface from the centerline of the microchannel, channel residence time and average fluid velocity, respectively. The Inventors have recognized the following that are used in embodiments of the invention:

(i) The mass flux at the diffusion interfaces between two species is enhanced as the interface velocity is increased; and
(ii) The respective diffusion interfaces both progress transverse to the direction of the fluid flow (away from the centerline of the mixing microchannel) as one moves downstream through the mixing microchannel.

Based on (i) and (ii), passive mixing apparatus are described herein that perform enhanced mixing based on flow profile variation along the length of the microchannel. This flow profile variation is due to the sidewall designs described herein in the mixing microchannel that causes the maximum of the velocity profile, $v_{z-max}$, to be shifted or, rather "swept" in the transverse direction (to the flow direction) as one moves downstream through the mixing microchannel such that $v_{z-max}$ overlaps the transversely progressing diffusion interfaces (fronts) repeatedly over the length of the mixing microchannel.

With respect to (i), the overall mass flux at the interfaces would increase due to higher velocities. This is in contrast with the conventional T or Y mixer that has a constant parabolic velocity profile, where the maximum of the velocity profile is fixed at the centerline along the entire length of the mixing microchannel. Accordingly, for a conventional T or Y mixer, as the diffusion fronts move out transversely away from the centerline as one moves downstream through the mixing microchannel, the respective diffusion fronts both coincide with the slower moving lamellae of fluid. Lower diffusion interface-velocities result in rapid reduction of the diffusive flux and hence poor mixing performance provided by the conventional T or Y mixer.

Figure 2:
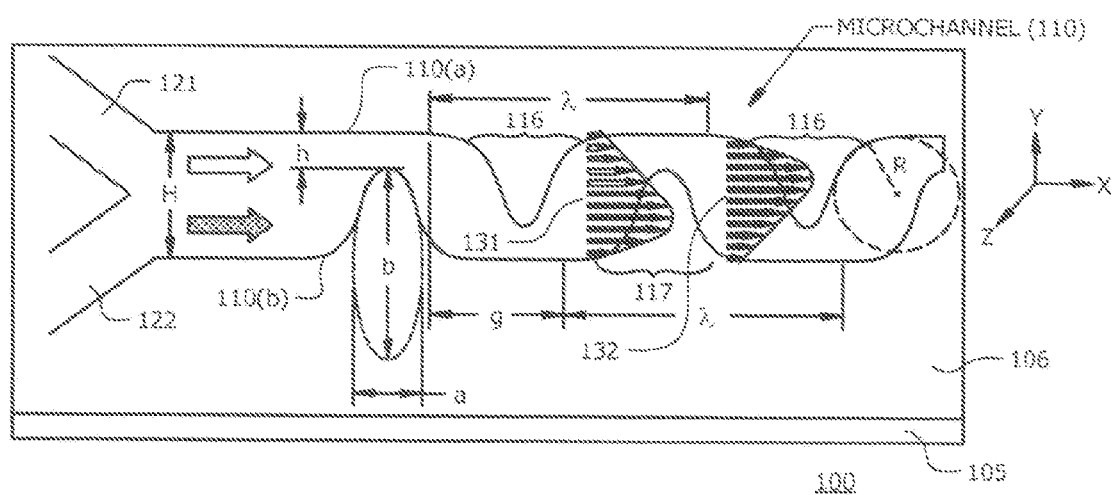
FIG. 2 shows a top view depiction of an exemplary micromixing apparatus, according to an embodiment of the invention.

FIG. 2 shows a top view depiction of an exemplary micromixing apparatus 100, according to an embodiment of the invention. Micromixing apparatus 100 comprises a substrate 105 having a top surface 106. Substrate 105 can comprise a variety of materials including an inorganic material (e.g., silicon, glass, quartz), an organic material (e.g., polycarbonate, polymethamethylacrylate, polydimethylsiloxane, cyclic olefin copolymer) or a metallic material (e.g. aluminum, titanium, iron alloys).

Micromixing apparatus 100 comprises a microchannel 110. Microchannel 110 can be formed from processing the top surface 106 of substrate 105 using a laser ablation process, such as with a polymer substrate using a single masking level. Another fabrication option comprises photolithography followed by a replication molding process in which a master template is made by photolithography and the final product is molded, imprinted or casted over the master template. However, the fabrication method for the master template is not restricted to photolithography. Conventional machining or electroplating procedures can also be used. Another fabrication alternative comprises a chemical etch process, such as in the case of a silicon substrate.

Yet another fabrication method can be used that is commonly referred to as "soft lithography". In this process, a photosensitive (PR) material (e.g., SU-8) is spin coated on the surface of a polished wafer, such as a silicon wafer. Micromixer features are transferred from a mask on the PR via conventional photo-lithography techniques. The developed patterns serve as a mold. Liquid polymer mixed with a curing agent is poured on the mold and allowed to cure at room temperature; taking the shape of the mold. The features will be cast on to the polymer generating open microcanals. Eventually, the layer with the features is peeled off the original surface and bonded to another blank layer of polymer or a glass slip forming closed microchannels. As known in the art, silicon substrates have the advantage of being able to form electronic devices on the same substrate (i.e. chip) as the micromixing apparatus 100.

Although not shown in FIG. 2, micromixing apparatus 100 generally comprises a packaged micromixing apparatus provided by adding a laminate layer, such as formed from a lamination process. For example, a thin PET foil coated with a melting adhesive film layer can be pressed by a heated lamination roller onto the surface 106 of the substrate 105 to provide a lid. The lid of the packaged micromixing apparatus will provide a planar top surface for the apparatus.

A first inlet 121 is for injecting a first fluid (liquid or gas) into the microchannel 110 and a second inlet 122 is for injecting a second fluid (liquid or gas) into the microchannel 110. The first and second fluid species are generally different in chemical composition. The first and second fluid flow in a flow direction (the x-direction shown in FIG. 2) along the length of the microchannel 110.

As shown in FIG. 2, the parameters a and b define the shape of the ellipsoid used to generate the sidewall patterns for first sidewall surface 110($a$) and second sidewall surface 110($b$) of microchannel 110. Although first sidewall surface 110($a$) and second sidewall surface 110($b$) are shown as mirror images of one another, being offset in the flow direction by the parameter g shown in FIG. 2, embodiments of the invention are not limited to first sidewall surface 110($a$) and second sidewall surface 110($b$) being mirror images of one another. Other sidewall feature shapes can be generated using trigonometric functions (sin, cosine) which repeat on either side of the microchannel with a phase lag, such that the arrangement expands and contracts the flow profile non-symmetrically. Moreover, although both first sidewall surface 110($a$) and second sidewall surface 110($b$) include both straight wall and curved wall portions, in another embodiment first sidewall surface 110($a$) and second sidewall surface 110($b$) include curved wall portions throughout.

As shown in FIG. 2, the microchannel 110 has a channel width defined by the distance between opposing first sidewall surface 110($a$) and second sidewall surface 110($b$) which is seen to change along the length of the microchannel 110 and is thus referred to as a variable channel width. The channel width is in the direction perpendicular to the flow direction (the x-direction shown in FIG. 2), and thus is the y-direction in FIG. 2. The variable channel width is seen to vary between a minimum channel width h and a maximum channel width H.

As shown in FIG. 2, $\lambda$ is the periodic length between repeating sidewall profiles and the parameter g represents the lag between the respective sidewall profiles on opposing sides of the microchannel 110. If the parameter g becomes too short or too long, keeping other parameters constant, sidewall interference and parallel opposing walls, generally result. The parameter g shown in FIG. 2 varies within the period $\lambda$ in its magnitude, and is typically $0.4\lambda < g < 1.6\lambda$.

The first sidewall surface 110($a$) includes plurality of first curved surface portions 116 and the second sidewall surface 110($b$) includes plurality of second curved surface portions 117. The first curved surface portions 116 and second curved surface portions 117 are seen to be non-overlapping (not opposing one another) being offset by the parameter g so that the channel width varies along the length of the microchannel 110.

In the case a=b, the ellipsoid becomes a circle. The parameters a and b are chosen so that the sidewall shapes expand or contract the width of the microchannel asymmetrically with respect to the center line of the microchannel. The ellipse parameters a and b aid in defining how steeply each of the sidewalls contracts or expands. Although the respective curved surface portions 116 and 117 shown in FIG. 2 are shaped as ellipsoidal arcs, curved surface portions 116 and 117 can comprise other curved shapes, such as circular arcs.

The ratio of H:h quantifies the maximum degree of variation in channel width along the length of the microchannel 110. The ratio of H:h is $\geq 1.1:1.0$ such as 2:1 to 8:1, and is typically 3:1 to 5:1. Sharp corners can be removed by smoothening the walls using known methods such as the Bezier curve to ensure that no dead volume regions are created in the micromixing apparatus 100. In one embodiment, numerical simulations using ANSYS® software for two-dimensional numerical simulations using the FLOTRAN® module of ANSYS® to solve the laminar flow and multiple species equations result in values of H=200, h=50, a=300, b=100, R=100, $\lambda$=400 and g=200 with microchannel depth of 100 (units all µm) to achieve maximum mixing efficiency. The actual devices were built based on the simulation results. In terms of $\lambda$, the total length mixer length of the microchannel 110 was 50$\lambda$.

Microchannel 110 shown in FIG. 2 has optional periodicity in the first sidewall surface 110($a$) and the second sidewall surface 110($b$) so that the channel width varies periodically along the length of the microchannel 110. More specifically, the first curved surface portions 116 of the first sidewall surface 110($a$) and the second curved surface portions 117 of the second sidewall surface 110($b$) both repeat periodically with wavelength $\lambda$ along the channel length and thus have a constant spacing in the flow direction (the x-direction shown in FIG. 2).

In operation of micromixing apparatus 100 as shown in FIG. 2, the velocity profile (in flow direction, i.e. the x-direction) varies throughout the length of the microchannel 110 periodically due to the profile of the curved surface portions 116 and 117. Such an arrangement results in the maximum velocity value along the flow direction of the fluids shifting from the center and sweeping in the transverse direction periodically along the length of the microchannel 110, overlapping the progressing diffusion fronts, thus enhancing the diffusion to improve mixing of the first and second fluids. Accordingly, the maximum fluid velocity is generally away from the center of the width of the microchannel, and instead moves (changes) along the length of the microchannel 110 from being within the second fluid in position 131 (maximum fluid velocity=longest arrow) up to reach the first fluid (thus passing through the center of the width just briefly) in position 132 (maximum fluid velocity=longest arrow), then back to the first fluid, etc.

Micromixing apparatus described herein have several significant advantages as compared to conventional micromixing apparatus. Such mixing apparatus are planar and does not have complex 3D features. This simplifies fabrication and reduces fabrication expense. As described above, one step lithography can be used for the mold and replication of micromixing apparatus in polymer materials can be accomplished repeatedly over the life of the mold. In addition, the micromixing apparatus are passive, therefore only the fluids need to be pumped in and there are no additional complications. Moreover, micromixing apparatus described can be used as a standalone or integrated in a microfluidic platform. Furthermore, the function of the mixer is well suited for low flow rate applications encountered in majority of microfluidic applications.

Embodiments of the invention can be used in a variety of microfluidic device types. For example, a mixing apparatus (micro mixer) as described above, a chemistry reactor (micro reactor), a micro TAS LOC system and a microchemistry plant. Other exemplary applications include, but are not limited to, other technologies, including pressure sensors and medical diagnostic systems.

EXAMPLES

Embodiments of the invention are further illustrated by the following specific Examples, which should not be construed as limiting the scope or content of embodiments of the invention in any way.

A typical procedure for fabricating microchannels for micromixing apparatus referred to as "soft lithography" is described below. A layer photoresist (SU8 Microchem®, MA) is spin coated on a polished substrate. The thickness of the coating based on spinning speed would determine the height of the microchannels (15 seconds @500 rpm followed by 45 seconds @1,000 rpm). The soft-bake process includes two stages (10 minutes @70° C. followed by 30 minutes @105° C. on a hotplate). SU-8 is a high-contrast, epoxy based negative photoresist used for micromachining and other microelectronic and microfluidic applications, where thick, chemically and thermally stable features are desired. The next step is patterning via photolithography. SU-8 is optimized for near UV (350-400 nm) exposure (EVG 620 Mask Aligner, NY). The optimal exposure dose depends on film thickness (thicker films require higher dosage) and process parameters (total dosage for targeted thickness is within 350-400 mJ/cm$^2$). The UV-light exposed and subsequently thermally cross-linked portions of the film are rendered insoluble to liquid developers. SU-8 is used to create high aspect ratio structures with near vertical walls in very thick films due to its optical properties.

Post exposure bake is done directly after exposure in two steps (3 minutes @75° C. followed by 10 minutes @105° C.). After cooling the SU-8 developer (MICROCHEM®, MA) is used for developing the patterns. The fabricated SU-8 mold will be used to replicate patterns in the elastomeric resin. Patterns can be replicated as many times, depending on the quality of the mold. Sylgard 184 Silicone® (Dow Corning, MI) is used for fabricating the microchannels. The elastomer is mixed with the curing agent and poured on the mold and allowed to cure eventually taking the shape of the patterned micro-canals. The layer consisting of transferred patterns is bonded to another blank layer of PDMS or glass slide to create a closed fluidic channel by surface treatment (Corona treatment). Inlet and outlet ports are punched in the blank layers prior to bonding.

Figure 3:
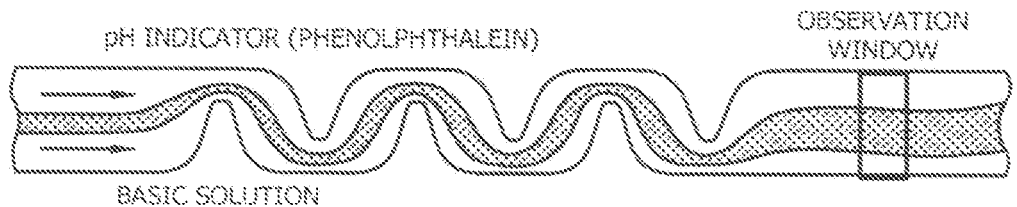
FIG. 3 shows an evaluation of mixing performance obtained from an exemplary micromixing apparatus according to an embodiment of the invention using color changes as a result of the mixing of a pH indicator (phenolphthalein) and a basic solution (sodium hydroxide, pH=12.5).

FIG. 3 shows an evaluation of mixing performance obtained from an exemplary micromixing apparatus according to an embodiment of the invention using color changes as a result of mixing of a pH indicator (phenolphthalein 1%, isopropyl alcohol 60%, water balance) and a basic solution (1.6% sodium hydroxide, pH=12.5). The two colorless solutions were introduced at the inlets of the devices by an infusion pump. When mixed, a pink/purple region was created which expands transversely with two interfaces away from the centerline of the microchannel as the solutions further mix downstream as shown in FIG. 3. Color images at select cross sections were converted into thresholded grayscale images. Dark pixels, gray intensity I=0, show fully mixed regions whereas bright pixels, I=1, are non-mixed portions of the flow. Standard deviation of gray intensity around the darkest gray pixel (completely mixed region in the middle of the channel) is calculated for the pixels of the selected cross section.

$$\sigma = \left[\frac{1}{n}\sum_{i=1}^{n}(I_{min}-I_i)^2\right]^{\frac{1}{2}} \qquad (5)$$

n is the number of the cross section pixels, $I_i$ is gray intensity of pixel i of the selected cross section and $I_{min}$ is the minimum gray intensity. When there is no mixing, the standard deviation, $\sigma=1$, and ideally at full mixing it will reach 0 as all pixels attain uniform gray intensity. The level of mixing (percentage) is defined as follows:

$$M=(1-\sigma)\times 100 \qquad (6)$$

Figure 4A:
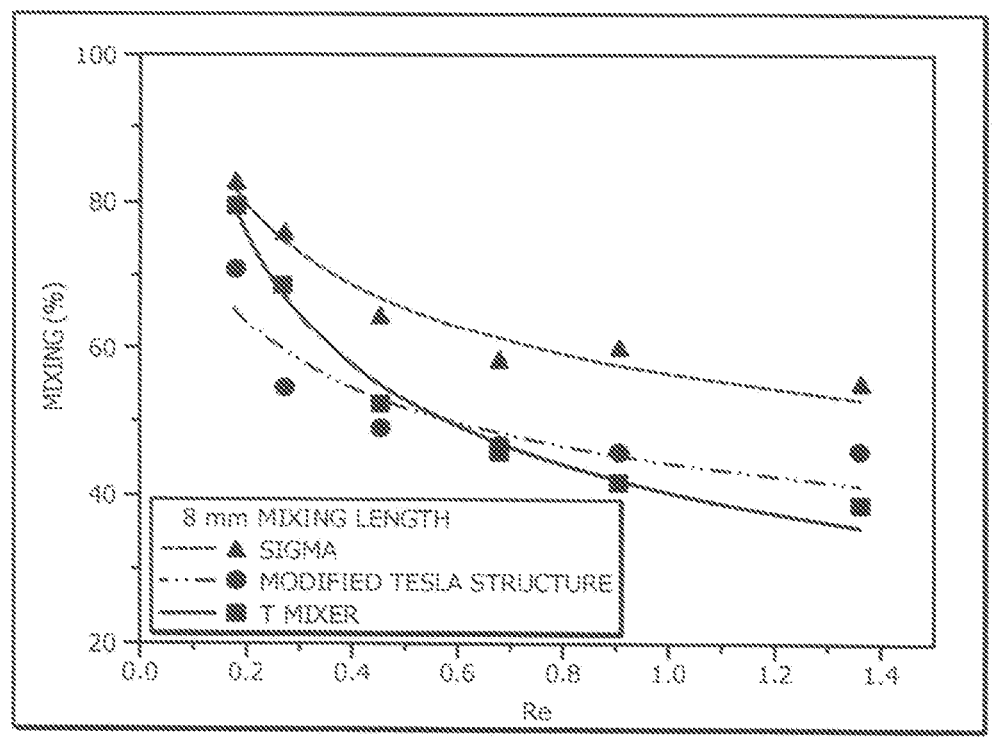
Figure 4B:
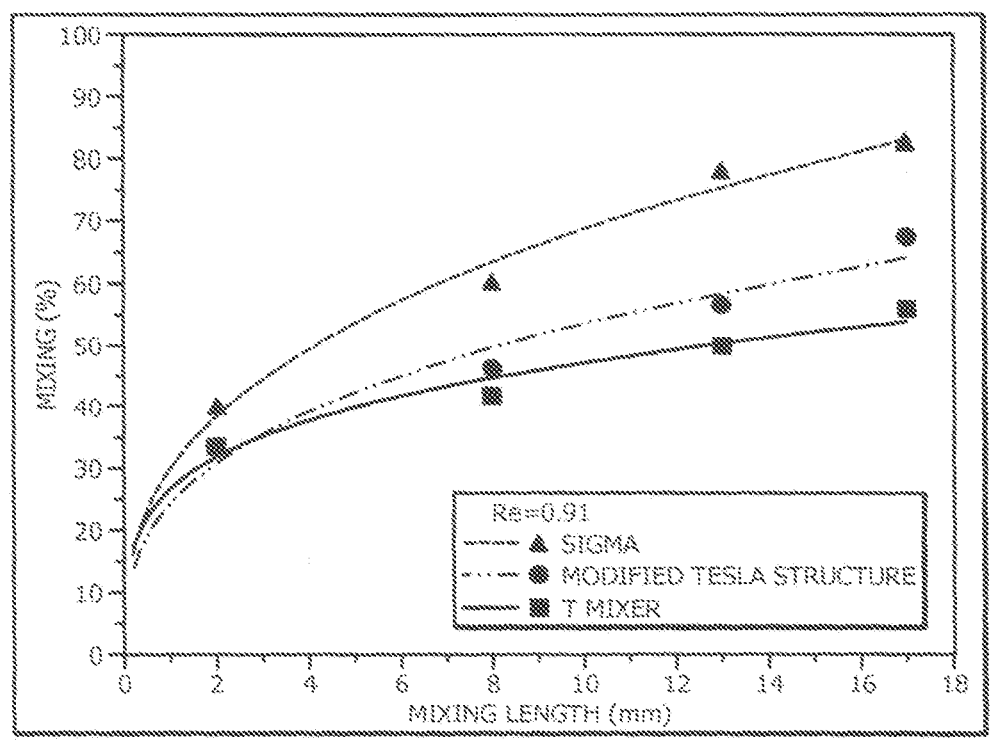
FIG. 4B shows mixing performance at a given flow rate (Q=1000 µl/hr, Re=0.91) as a function of mixing length, according to an embodiment of the invention.

FIG. 4A shows mixing performance obtained from an exemplary micromixing apparatus according to an embodiment of the invention at a given mixing length (L=8 mm) as a function of flow Reynolds number (Re), while FIG. 4(b) shows mixing performance at a given flow rate (Q=1,000 µl/hr, Re=0.91) as a function of mixing length. The mixing performance was evaluated in comparison to the T mixer and the Tesla mixer as a function of flow Reynolds number and mixing length. The results obtained evidences the effectiveness of the passive micromixing concept and significant improvement of mixing performance over existing passive micro-mixer designs.

Figure 5:
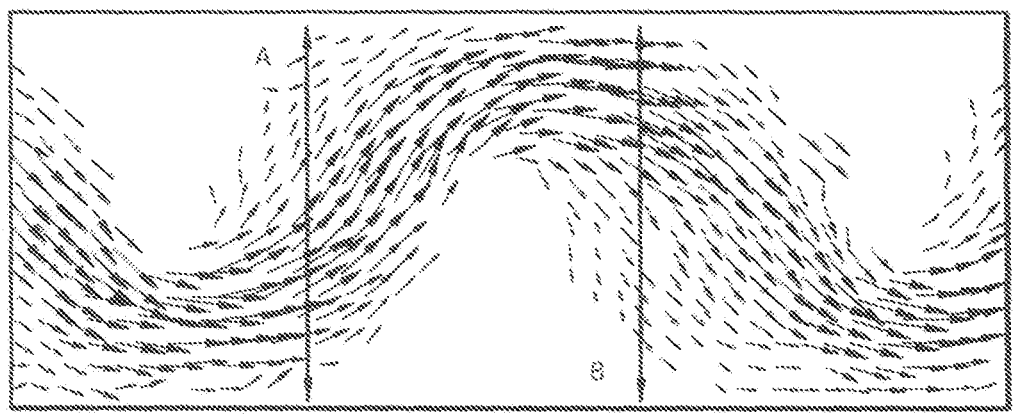
FIG. 5 shows a micro particle image velocimetry measurement obtained from an exemplary micromixing apparatus according to an embodiment of the invention that is seen to be primarily a laminar flow.

FIG. 5 shows micro particle image velocimetry (µPIV) measurement of a primarily laminar flow obtained from an exemplary micromixing apparatus according to an embodiment of the invention. The bottom layers as shown are seen to move faster than the top layers at the section identified as "A", whereas in the section identified as "B" the situation is reversed so that the top layers move faster than the bottom layers confirming variation of the velocity profile. The maximum of the velocity profile sweeps across the transverse direction, repeatedly, overlapping the progressing diffusion fronts throughout the length of the mixing microchannel.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. For example, embodiments of the invention can also include powered sources to further enhance fluid mixing, such as vibrational sources to induce vibration in the microchannel. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A fluid mixing method, comprising:
    providing a micromixing apparatus comprising a mixing microchannel having a channel length and a continuously variable channel width along said channel length defined by a first sidewall surface and an opposing second sidewall surface, wherein said first sidewall surface includes a plurality of first curved surface portions and said second sidewall surface includes a plurality of second curved surface portions, said plurality of first curved surface portions and said plurality of second curved surface portions non-overlapping by being offset with respect to one another along said channel length to provide said continuously variable channel width, and wherein said continuously variable channel width continuously varies from a minimum channel width h to a maximum channel width H in a ratio of H:h≥1.1:1.0;
    flowing a first and a second fluid into said mixing microchannel, wherein said first and said second fluid flow in a flow direction in said mixing microchannel along said channel length, and
    passively varying a flow velocity profile of said first and said second fluid along said channel length of said mixing microchannel, wherein said continuously variable channel width exclusively controls said flow velocity profile.

2. The method of claim 1, wherein a maximum of said flow velocity profile coincides with transversely progressing diffusion fronts of said first and said second fluid.

3. The method of claim 1, wherein said passively varying comprises periodically varying.

4. The method of claim 1, wherein said first fluid and said second fluid comprise liquids.

5. The method of claim 1, wherein said first fluid and said second fluid comprise gases.

6. The method of claim 1, wherein said plurality of first curved surface portions of said first sidewall surface and said plurality of second curved surface portions of said second sidewall surface both repeat periodically along said channel length and have a constant spacing in said flow direction between respective ones of said plurality of first curved surface portions and said plurality of second curved surface portions.

7. The method of claim 1, wherein said plurality of first curved surface portions and said plurality of second curved surface portions are ellipsoidal arc shaped.

8. The method of claim 7, wherein said first sidewall surface and said second sidewall surface are mirror images of one another with a lateral offset in said flow direction.

9. The method of claim 8, wherein a periodic length between repeating ones of said plurality of first curved surface portions and said plurality of second curved surface portions is $\lambda$ and g represents a lag between the respective ones of said plurality of first curved surface portions and said plurality of second curved surface portions on opposing sides of said mixing microchannel, and wherein $0.4\lambda < g < 1.6\lambda$.

10. The method of claim 8, wherein said lateral offset in said flow direction is 50 to 500 μm.

11. The method of claim 1, wherein said ratio of H:h is from 2:1 to 8:1.

12. The method of claim 1, wherein said first sidewall surface and said second sidewall surface include both straight wall portions and curved wall portions.

* * * * *